US012322719B2

(12) United States Patent
Vincent

(10) Patent No.: US 12,322,719 B2
(45) Date of Patent: Jun. 3, 2025

(54) SEMICONDUCTOR DEVICE STRUCTURE AND METHOD THEREFOR

(71) Applicant: NXP USA, INC., Austin, TX (US)

(72) Inventor: Michael B. Vincent, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 431 days.

(21) Appl. No.: 17/655,799

(22) Filed: Mar. 22, 2022

(65) Prior Publication Data

US 2023/0307403 A1 Sep. 28, 2023

(51) Int. Cl.
*H01L 23/00* (2006.01)
*H01L 23/31* (2006.01)

(52) U.S. Cl.
CPC .......... *H01L 24/19* (2013.01); *H01L 23/3142* (2013.01); *H01L 23/562* (2013.01); *H01L 24/20* (2013.01); *H01L 2224/19* (2013.01); *H01L 2224/2105* (2013.01); *H01L 2224/211* (2013.01)

(58) Field of Classification Search
CPC ...................................................... H01L 24/19
See application file for complete search history.

(56) References Cited

U.S. PATENT DOCUMENTS

| 5,688,564 | A  | 11/1997 | Coddet et al.   |
| 7,026,014 | B2 | 4/2006  | Luzinov et al.  |
| 7,276,401 | B2 | 10/2007 | Cowens et al.   |
| 7,393,461 | B2 | 7/2008  | Feng et al.     |
| 7,629,204 | B2 | 12/2009 | Hsu             |
| 8,610,238 | B2 | 12/2013 | Kaltalioglu et al. |
| 8,916,972 | B2 | 12/2014 | Lin et al.      |
| 2003/0047801 | A1 | 3/2003 | Azuma |
| 2003/0052414 | A1 | 3/2003 | Cowens et al. |
| 2008/0023827 | A1 | 1/2008 | Farooq et al. |

(Continued)

FOREIGN PATENT DOCUMENTS

| CN | 111082311 A | * | 4/2020 | ............. H01S 5/026 |
| JP | 2006049427 A |   | 2/2006 | |

OTHER PUBLICATIONS

U.S. Appl. No. 17/811,132, filed Jul. 7, 2022, entitled "Semiconductor Device With Under-Bump 1 Metallization and Method Therefor".

(Continued)

*Primary Examiner* — Mohammad M Choudhry

(57) ABSTRACT

A method of manufacturing a semiconductor device is provided. The method includes providing a semiconductor die at least partially encapsulated with an encapsulant. A first non-conductive layer is deposited over an active side of the semiconductor die and a surface of the encapsulant. A first opening is formed in the first non-conductive layer exposing a portion of a bond pad of the semiconductor die. A conductive interconnect trace is formed over a portion of the first non-conductive layer and the exposed portion of the bond pad. A second non-conductive layer is formed over the conductive interconnect trace and exposed portions of first non-conductive layer with a second opening formed in the second non-conductive layer exposing a portion of the conductive interconnect trace. A laser ablated structure is formed at a surface of the second non-conductive layer proximate to a perimeter of the second opening.

13 Claims, 11 Drawing Sheets

(56) References Cited

U.S. PATENT DOCUMENTS

| | | |
|---|---|---|
| 2008/0023846 A1 | 1/2008 | Seki et al. |
| 2008/0174025 A1 | 7/2008 | Ryu et al. |
| 2008/0265410 A1 | 10/2008 | Chang et al. |
| 2009/0196010 A1 | 8/2009 | Nakasato et al. |
| 2011/0266670 A1 | 11/2011 | England et al. |
| 2012/0061835 A1 | 3/2012 | Hosseini et al. |
| 2012/0104625 A1 | 5/2012 | Park et al. |
| 2013/0249080 A1 | 9/2013 | Lin et al. |
| 2014/0264839 A1 | 9/2014 | Tsai et al. |
| 2017/0125319 A1 | 5/2017 | Yanagida |
| 2017/0154862 A1 | 6/2017 | Chang et al. |
| 2017/0352631 A1 | 12/2017 | Chuang |
| 2018/0076151 A1 | 3/2018 | Min et al. |
| 2019/0081014 A1 | 3/2019 | Itatani et al. |
| 2020/0105689 A1* | 4/2020 | Hwang ............. H01L 23/49534 |
| 2020/0223014 A1 | 7/2020 | Costa et al. |
| 2022/0392989 A1 | 12/2022 | Kim et al. |
| 2023/0091632 A1 | 3/2023 | Kageyama et al. |

OTHER PUBLICATIONS

U.S. Appl. No. 17/239,888, filed Apr. 26, 2021, entitled "Semiconductor Device Under Bump Structure and Method Therefor".

* cited by examiner

SEMICONDUCTOR DEVICE STRUCTURE AND METHOD THEREFOR

BACKGROUND

Field

This disclosure relates generally to semiconductor device packaging, and more specifically, to a semiconductor device structure and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some features and applications, the configuration of the semiconductor device packages may be susceptible to lower reliability which could impact performance and system costs. Accordingly, significant challenges exist in accommodating these features and applications while minimizing the impact on semiconductor devices' reliability while minimizing impact on performance and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having a laser ablated structure at an under-bump structure. The semiconductor device includes a semiconductor die partially encapsulated with an encapsulant. A non-conductive layer is formed over an active side of semiconductor die and corresponding surface of the encapsulant. An opening in the non-conductive layer is configured as a basis for the under-bump structure. The laser ablated structure is formed in a surface of a non-conductive layer substantially surrounding a perimeter of the opening, for example. The laser ablated structure is formed by removing material from the non-conductive layer in a patterned groove or channel with predetermined cross-sectional width and depth dimensions. A metal layer is deposited over the non-conductive layer and is patterned to form a conductive connector pad (e.g., under-bump structure) over the opening and laser ablated structure. By forming the connector pad in this manner, the connector pad is interlocked with the laser ablated structure and provides improved adhesion between the connector pad and the underlying non-conductive layer while serving to arrest cracks that may form when subjected to extreme stress conditions.

Figure 1:
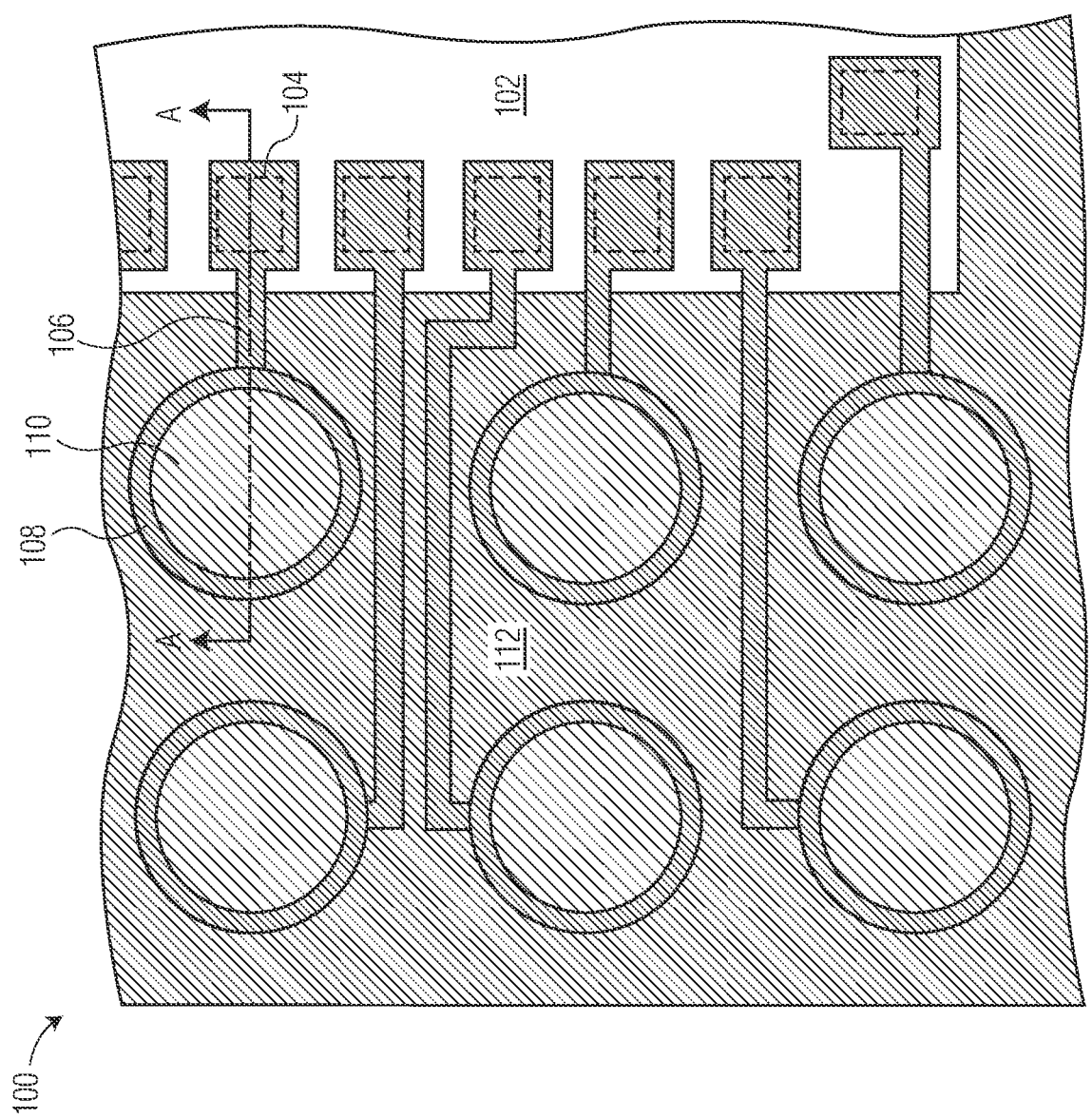
FIG. 1 illustrates, in a simplified plan view, an example semiconductor device having a laser ablated structure in accordance with an embodiment.

FIG. 1 illustrates, in a simplified bottom-side-up plan view, a portion of an example semiconductor device 100 having a laser ablated structure in accordance with an embodiment. The device 100 includes a semiconductor die 102, an encapsulant 112 encapsulating a portion of the semiconductor die 102, one or more non-conductive layers (not shown) formed over the final passivation of the semiconductor die and encapsulant, conductive interconnect traces 106, and conductive connector pads 108 connected to respective traces. In this embodiment, a conductive (e.g., metal) layer is patterned to form traces 106 configured to interconnect to bond pads 104 of the semiconductor die 102 with respective connector pads 108. In this embodiment, the conductive layer may be characterized as a redistribution layer. Conductive ball connectors 110 are affixed to the respective connector pads 108. Detailed features of the device 100 such as the one or more non-conductive layers are not shown for illustration purposes. The example semiconductor device 100 depicted in FIG. 1 may be characterized as having a fan-out panel level packaging type. Cross-sectional views of the example semiconductor device 100 taken along line A-A of FIG. 1 at stages of manufacture are depicted in FIG. 2 through FIG. 7.

The semiconductor die 102 has an active side (e.g., major side having circuitry) and a backside (e.g., major side opposite of the active side). The semiconductor die 102 depicted in FIG. 1 is in an active side up orientation. The semiconductor die 102 includes bond pads 104 at the active side configured for connection to printed circuit board (PCB) by way of the traces 106 and the connector pads 108, for example. The semiconductor die 102 may be formed from any suitable semiconductor material, such as silicon, germanium, gallium arsenide, gallium nitride, silicon nitride, silicon carbide, and the like. The semiconductor die 102 may further include any digital circuits, analog circuits, RF circuits, memory, signal processor, MEMS, sensors, the like, and combinations thereof. The conductive connectors 110 affixed to the connector pads 108 of device 100 may be in the form of suitable conductive structures such as solder balls, gold studs, copper pillars, and the like.

FIG. 2 through FIG. 7 illustrate, in simplified cross-sectional views, a portion of the example semiconductor device 100 taken along line A-A of FIG. 1 at stages of manufacture in accordance with an embodiment.

Figure 2:
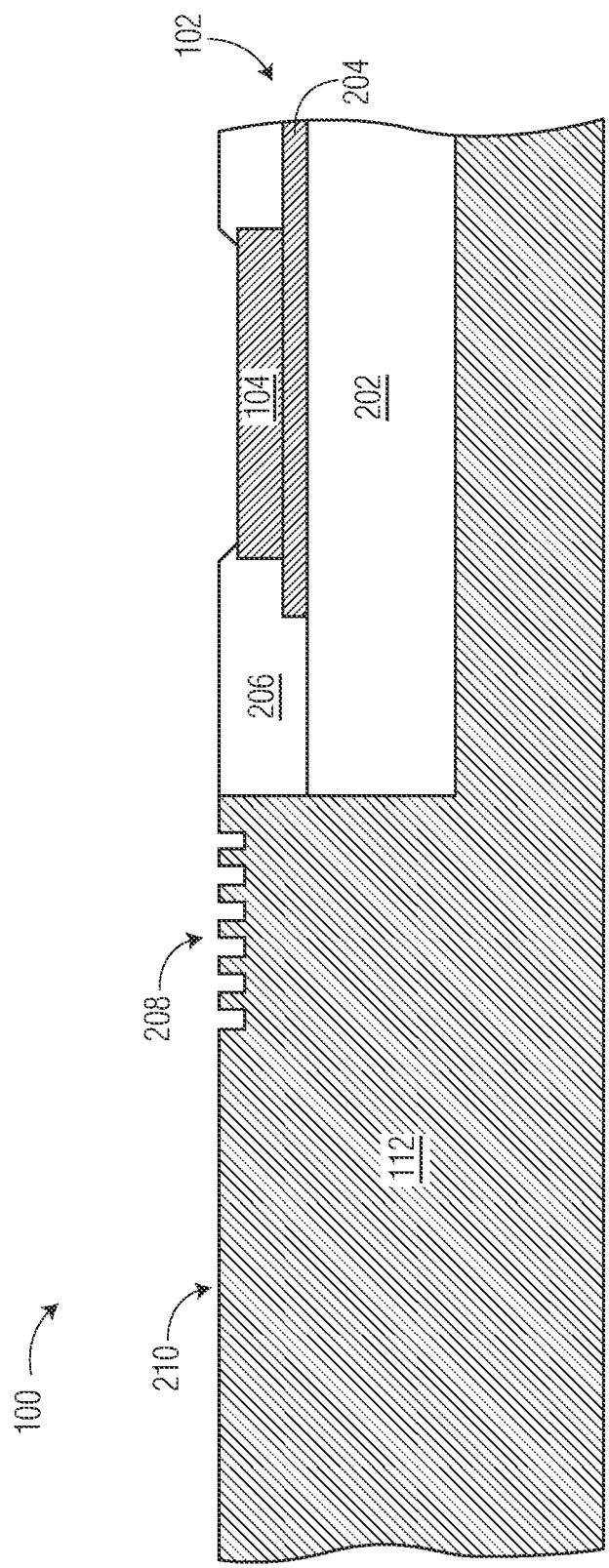
FIG. 2 through FIG. 7 illustrate, in simplified cross-sectional views, the example semiconductor device taken along line A-A of FIG. 1 at stages of manufacture in accordance with an embodiment.

FIG. 2 illustrates the portion of the example semiconductor device 100 at a stage of manufacture in accordance with an embodiment. At this stage of manufacture, the example semiconductor die 102 partially encapsulated with the encapsulant 112 is provided. The active side of the semiconductor die 102 is exposed (e.g., not encapsulated) and substantially coplanar with a first surface 210 of the encapsulant 112. The semiconductor die 102 includes a substrate (e.g., bulk) portion 202, a conductive interconnect trace 204 (e.g., copper, aluminum, or other suitable metal), a bond pad 104 conductively connected to the trace, and a final passivation layer 206 formed over the active side of the die. The semiconductor die 102 may include any number of conductive interconnect layers and passivation layers. For illustration purposes, the interconnect layer forming trace 204 and the final passivation layer 206 are depicted.

In this embodiment, a first laser ablated structure 208 is formed at the first surface 210 of the encapsulant 112. The laser ablated structure 208 is configured to enhance adhesion between the encapsulant 112 and a layer formed over the encapsulant at a subsequent stage of manufacture, for example. The laser ablated structure 208 may be formed by way of a focused pulsed laser, for example, configured to remove material in a predetermined pattern at the first surface 210 of the encapsulant. The predetermined pattern may be formed having desired cross-sectional depth and width dimensions sufficient for enhancing interlevel adhesion between the encapsulant 112 and a subsequent layer. It may be desirable to locate the laser ablated structure 208 near the interface between the encapsulant 112 and the semiconductor die 102 for reduced risk of delamination of the subsequent layer when under extreme stress conditions.

Figure 3:
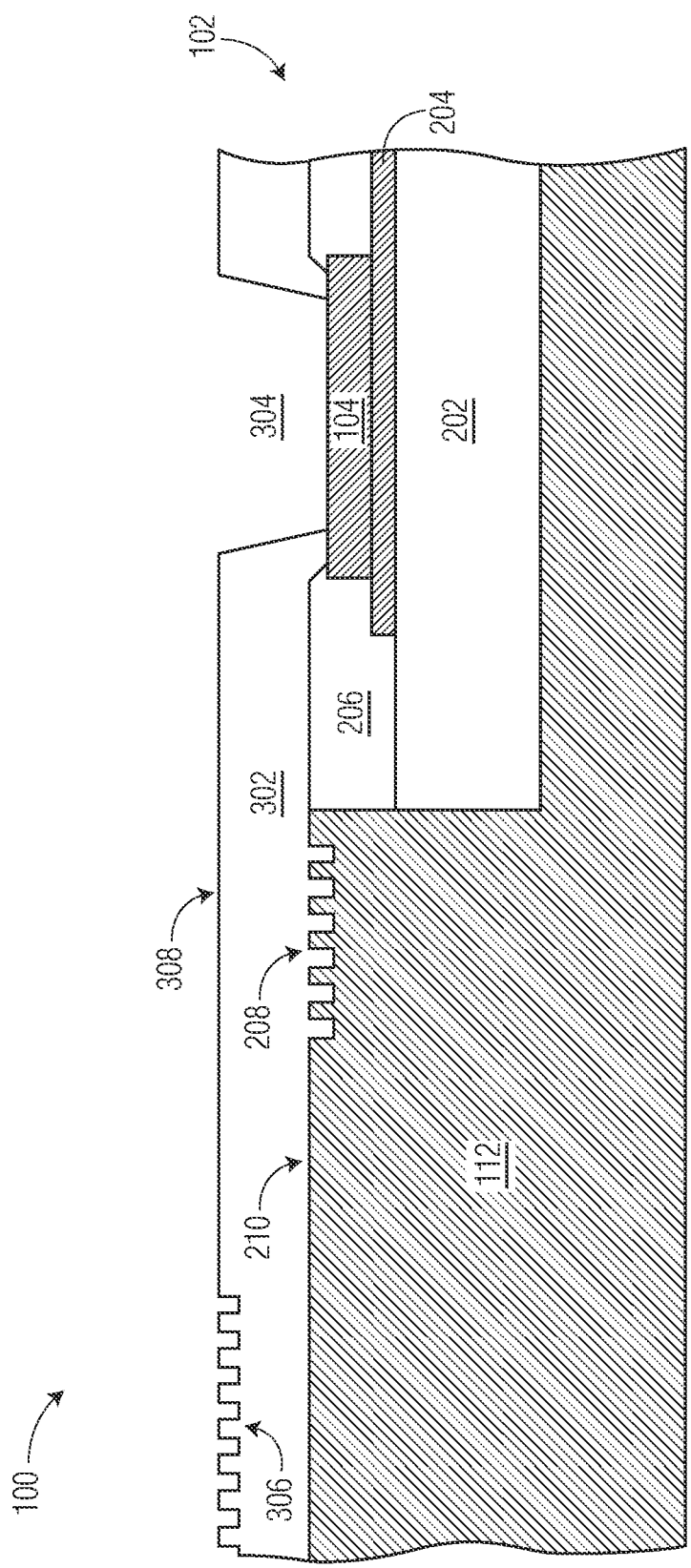

FIG. 3 illustrates the portion of the example semiconductor device 100 at a subsequent stage of manufacture in accordance with an embodiment. At this stage of manufacture, a first non-conductive layer 302 is deposited or otherwise formed over the active side of the semiconductor die 102 and the first surface 210 of the encapsulant 112. Because the non-conductive layer 302 is formed over the laser ablated structure 208, the non-conductive layer 302 is interlocked with the laser ablated structure 208 thus providing improved adhesion between the non-conductive layer 302 and the underlying encapsulant 112. The non-conductive 302 layer may be formed from suitable non-conductive materials such as a photo-imagable polymer material characterized as a photosensitive dielectric material layer. In this embodiment, an opening 304 is patterned and formed in the non-conductive layer 302. The opening 304 is formed through the non-conductive layer 302 and located over the bond pad 104 to expose a portion of the surface of the bond pad.

In this embodiment, a second laser ablated structure 306 is formed at a first (e.g., outermost) surface 308 of the non-conductive layer 302. The laser ablated structure 306 is configured to enhance adhesion between the non-conductive layer 302 and a layer formed over the non-conductive layer 302 at a subsequent stage of manufacture, for example. The laser ablated structure 306 may be formed by way of a focused pulsed laser, for example, configured to remove material in a predetermined pattern at the first surface 308 of the non-conductive layer 302. The predetermined pattern may be formed having desired cross-sectional depth and width dimensions sufficient for enhancing interlevel adhesion between the non-conductive layer 302 and a subsequent layer.

Figure 4:
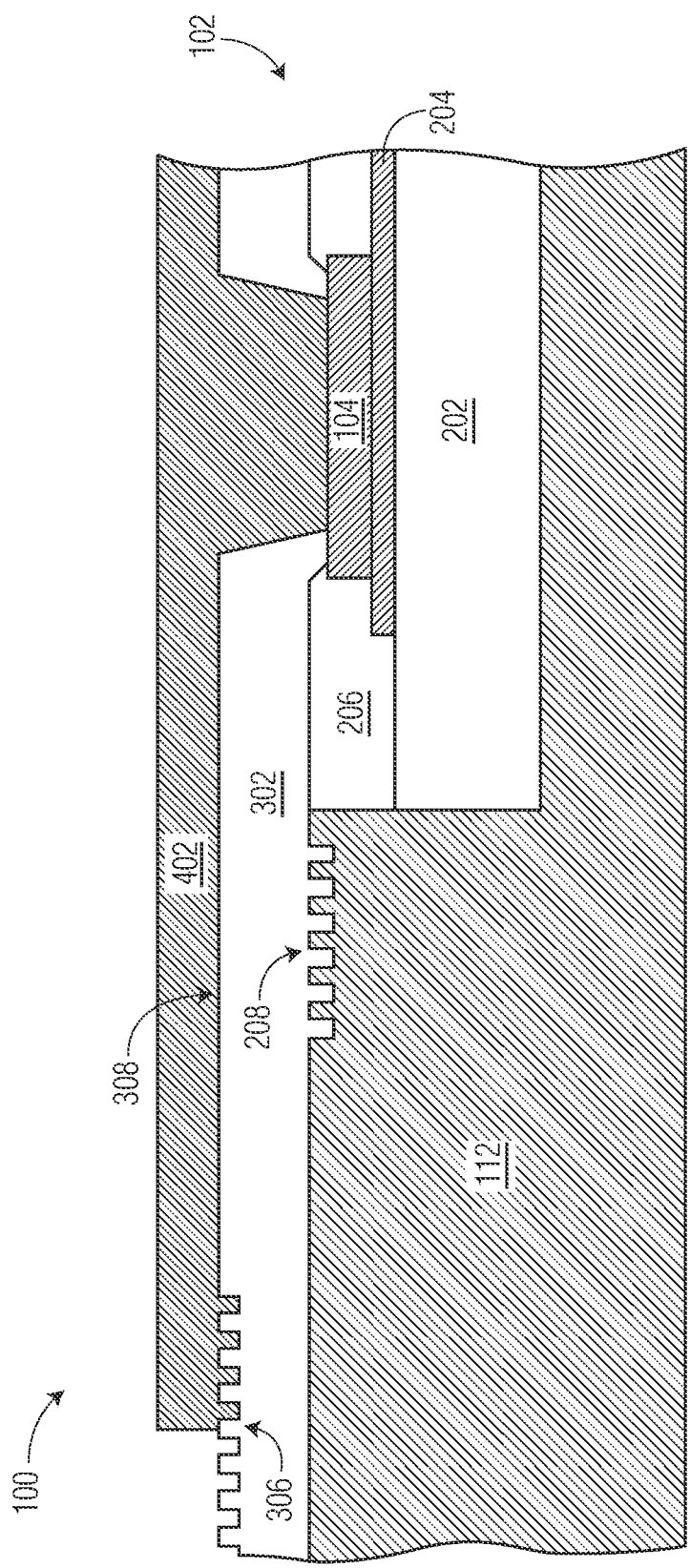

FIG. 4 illustrates the portion of the example semiconductor device 100 at a subsequent stage of manufacture in accordance with an embodiment. At this stage of manufacture, a conductive (e.g., metal) layer is deposited or otherwise formed over the first surface 308 of the non-conductive layer 302 and patterned to form conductive interconnect trace 402 connected to the bond pad 104. The trace 402 corresponds to the trace 106 of the plan view depicted in FIG. 1. The conductive interconnect trace 402 is formed over a portion of the laser ablated structure 306 at the first surface 308 of the non-conductive layer 302 and the exposed portion of the bond pad 104. Because the trace 402 is formed over a portion of the laser ablated structure 306, the trace 402 is interlocked with the laser ablated structure 306 thus providing improved adhesion between the trace 402 and the underlying non-conductive layer 302. It may be desirable to locate the laser ablated structure 306 such that a distal end portion of the trace 402 overlaps at least a portion of the laser ablated structure 306 to further reduce risk of delamination when under extreme stress conditions. In this embodiment, the trace 402 may be formed from a copper or other suitable metal or metal alloy material. In some embodiments, a seed layer (not shown) may be utilized in a plating process to form the conductive layer.

Figure 5:
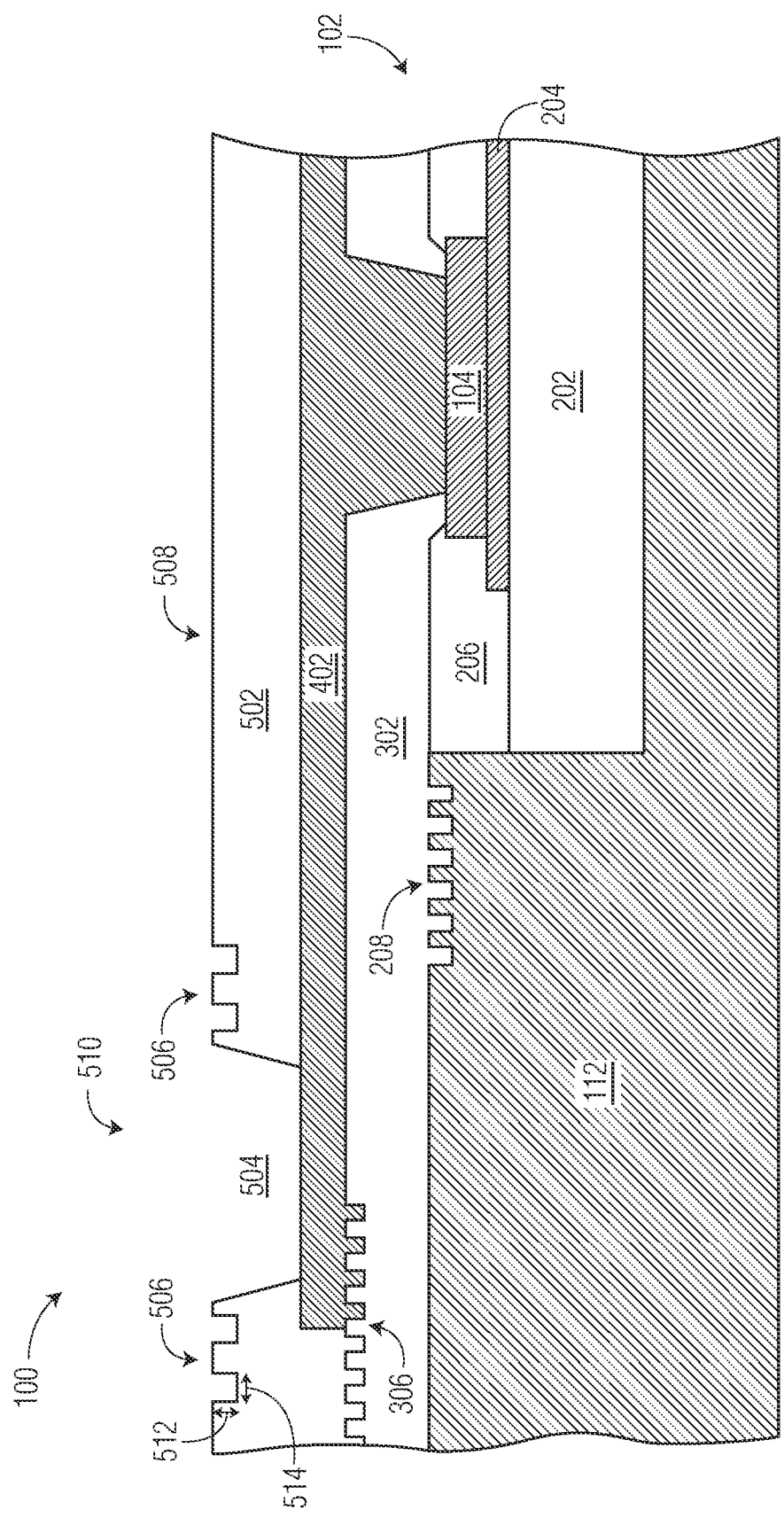

FIG. 5 illustrates the portion of the example semiconductor device 100 at a subsequent stage of manufacture in accordance with an embodiment. At this stage of manufacture, a second non-conductive layer 502 is deposited or otherwise formed over the trace 402 and the exposed portions of the non-conductive layer 302. The non-conductive 502 layer may be formed from a photo-imagable polymer material or other suitable non-conductive material. In this embodiment, an opening 504 is patterned and formed in the non-conductive layer 502. The opening 504 is formed through the non-conductive layer 502 and located over a portion of the trace 402 to expose a portion of the surface of the trace. The opening 504 is configured to serve as a basis for an under-bump structure 510, for example.

In this embodiment, a third laser ablated structure 506 is formed at a first (e.g., outermost) surface 508 of the non-conductive layer 502. The laser ablated structure 506 is configured to serve as a crack arrestor and enhance adhesion between the non-conductive layer 502 and a conductive layer formed over the non-conductive layer 502 at a subsequent stage of manufacture, for example. In this embodiment, the laser ablated structure 506 is formed as a predetermined pattern of two substantially concentric rings surrounding the perimeter of the opening 504. In other embodiments, the laser ablated structure 506 may be formed having other patterned shapes and configurations proximate to the perimeter of the opening 504. In some embodiments, the laser ablated structure 506 may be formed at least partially surrounding the perimeter and proximate to the perimeter of the opening 504 on a side more susceptible to crack formation. The laser ablated structure 506 may be formed by way of a focused pulsed laser, for example, configured to remove material in a predetermined pattern at the first surface 508 of the non-conductive layer 502. The predetermined pattern may be formed having desired cross-sectional depth 512 and width 514 dimensions sufficient for enhancing interlevel adhesion between the non-conductive layer 502 and a subsequent layer. For example, the cross-sectional depth 512 dimension may be in a range of approximately 5-10 microns and a cross-sectional width 514 (or diameter) dimension may be in a range of approximately 5-50 microns in this embodiment. In other embodiments, the cross-sectional depth 512 and width 514 dimensions may include other ranges. Simplified plan views of example laser ablated structures are depicted in FIG. 8 through FIG. 11.

In the embodiment depicted in FIG. 5, the non-conductive layer 502 is formed over a portion of the laser ablated structure 306. Because the non-conductive layer 502 is formed over a portion of the laser ablated structure 306, the non-conductive layer 502 is interlocked with the laser ablated structure 306 thus providing improved adhesion between the non-conductive layer 502 and the underlying non-conductive layer 302.

Figure 6:
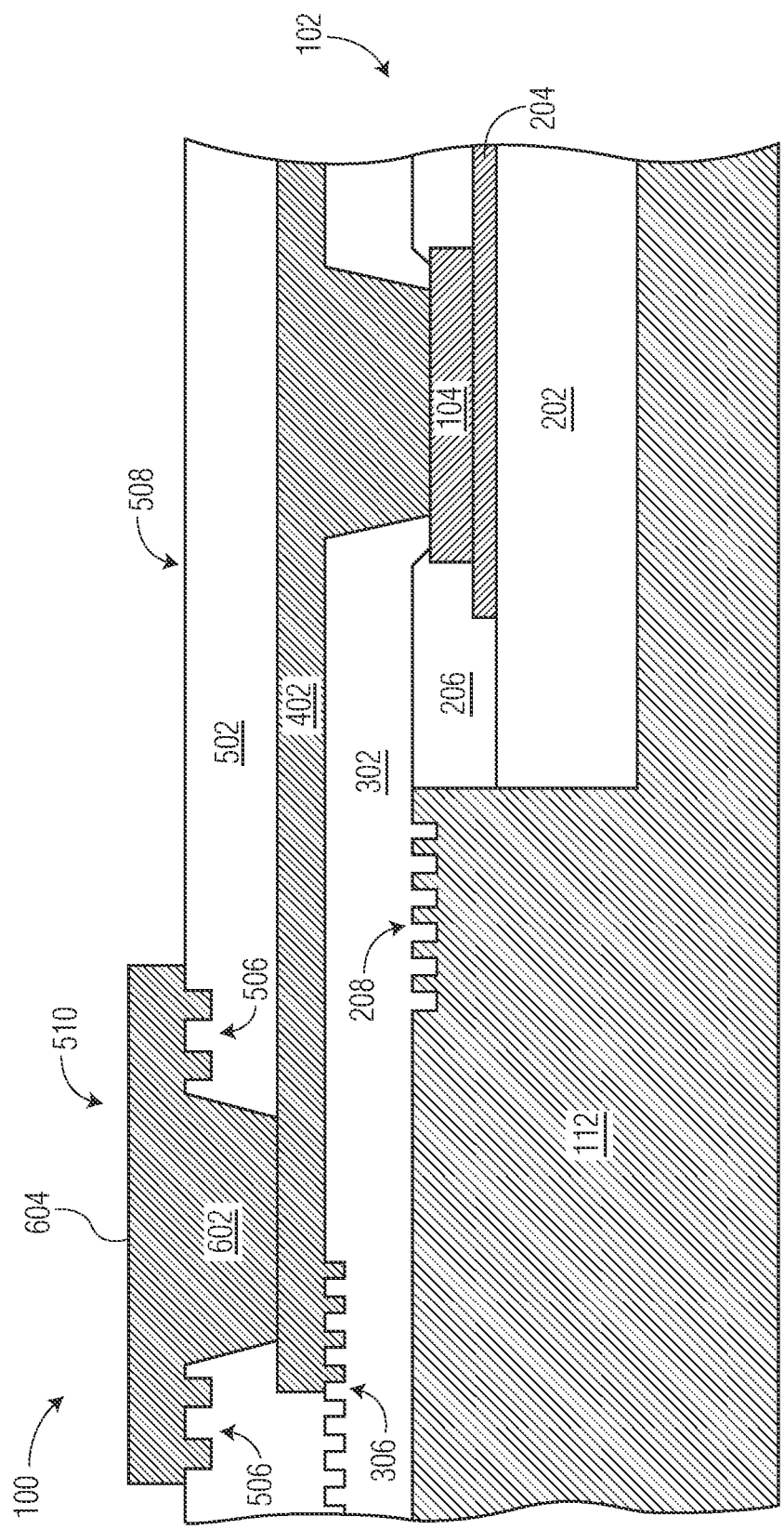

FIG. 6 illustrates the portion of the example semiconductor device 100 at a subsequent stage of manufacture in accordance with an embodiment. At this stage of manufacture, a second conductive (e.g., metal) layer is deposited or otherwise formed over the first surface 508 of the non-conductive layer 502 and patterned to form a conductive connector pad 602. The connector pad 602 corresponds to the connector pad 108 of the plan view depicted in FIG. 1. The connector pad 602 is formed over the laser ablated structure 506 at the first surface 508 of the non-conductive layer 502 and the exposed portion of the trace 402. Accordingly, the connector pad 602 is interlocked with the laser ablated structure 506 and provides improved adhesion between the connector pad 602 and the underlying non-conductive layer 502 and serves to arrest cracks that may form when subjected to extreme stress conditions. As result of forming the connector pad 602 over the opening (504), a depression or cavity (not shown) may form at the surface 604 of the connector pad 602. The connector pad 602 serves as the under-bump structure 510 conductively connected to trace 402 and configured for attachment to a PCB by way of a conductive connector, for example. In this embodiment, the connector pad 602 may be formed from a copper or other suitable metal or metal alloy material. In some embodiments, a seed layer (not shown) may be utilized in a plating process to form the conductive layer.

Figure 7:
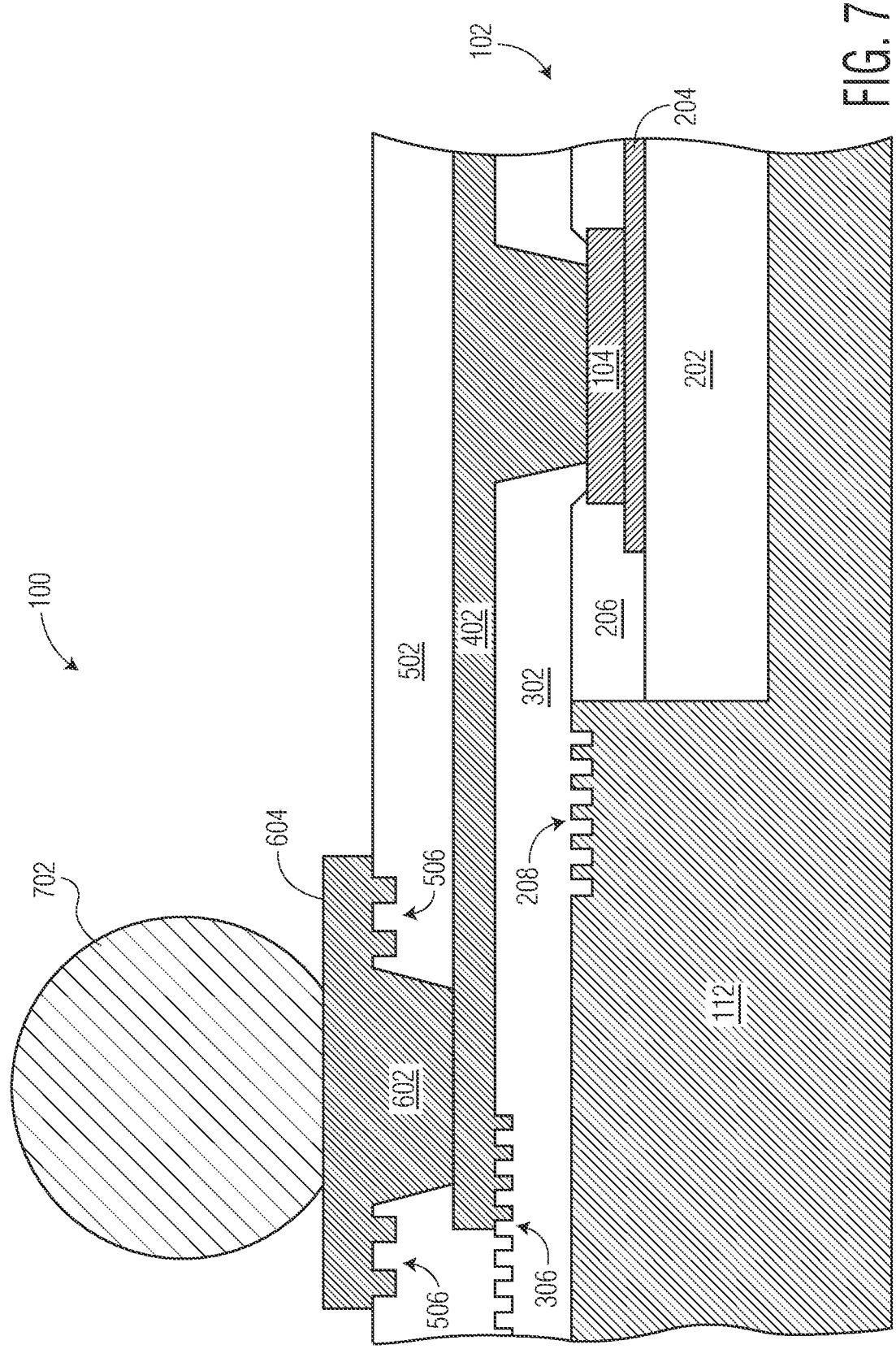

FIG. 7 illustrates the portion of the example semiconductor device 100 at a subsequent stage of manufacture in accordance with an embodiment. At this stage of manufacture, a conductive connector 702 (e.g., solder ball) is affixed to the connector pad 602. The conductive connector 702 corresponds to the conductive connector 110 of the plan view depicted in FIG. 1. The conductive connector 702 is placed onto the surface 604 of the connector pad 602 and reflowed or otherwise conductively attached. A flux material (not shown) may be applied before placing the conductive connector 702 onto the connector pad 602 to improve wetting and adhesion. In this embodiment, the conductive connector 702 is formed as a solder ball. In other embodiments, the conductive connector 702 may be formed as a solder bump, gold stud, copper pillar, or the like. Alternatively, a solder mask (not shown) can be applied partially over the connector pad 602 to define solder wettable areas. The exposed portions of the connector pad 602 may be subsequently treated with an organic soldering preservative (OSP), for example, to protect from oxidation.

FIG. 8 through FIG. 11 illustrate, in simplified plan views, example laser ablated structures of the semiconductor device 100 at a stage of manufacture in accordance with an embodiment. Each of the plan views depicted in FIG. 8 through FIG. 11 include a focused portion of the semiconductor device 100 showing the region of the opening 504 and corresponding example laser ablated structure consistent with the stage of manufacture depicted in FIG. 5.

Figure 8:
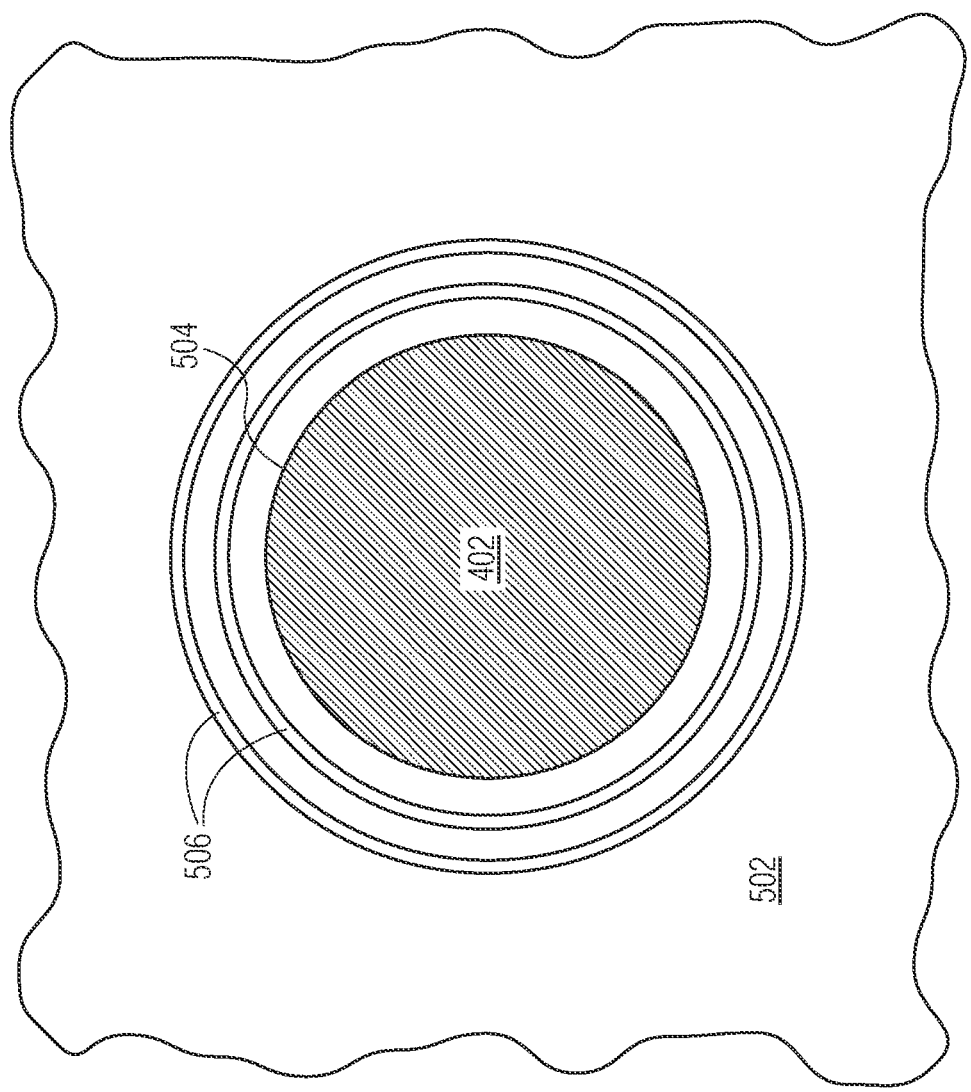
FIG. 8 through FIG. 11 illustrate, in simplified plan views, example laser ablated structures at a stage of manufacture in accordance with an embodiment.

FIG. 8 illustrates, in a simplified plan view, the focused portion of the example semiconductor device 100 with an example laser ablated structure 506 proximate to the opening 504 in accordance with an embodiment. In this embodiment, the laser ablated structure 506 includes a pattern formed as two concentric rings substantially surrounding the opening 504. Each ring of the laser ablated structure 506 is formed by a laser ablation process which removes material to form a groove or channel in the non-conductive layer 502. In this embodiment, the groove or channel is formed having a predetermined cross-sectional depth dimension in a range of approximately 5-10 microns and a predetermined cross-sectional width dimension in a range of approximately 5-50 microns.

Figure 9:
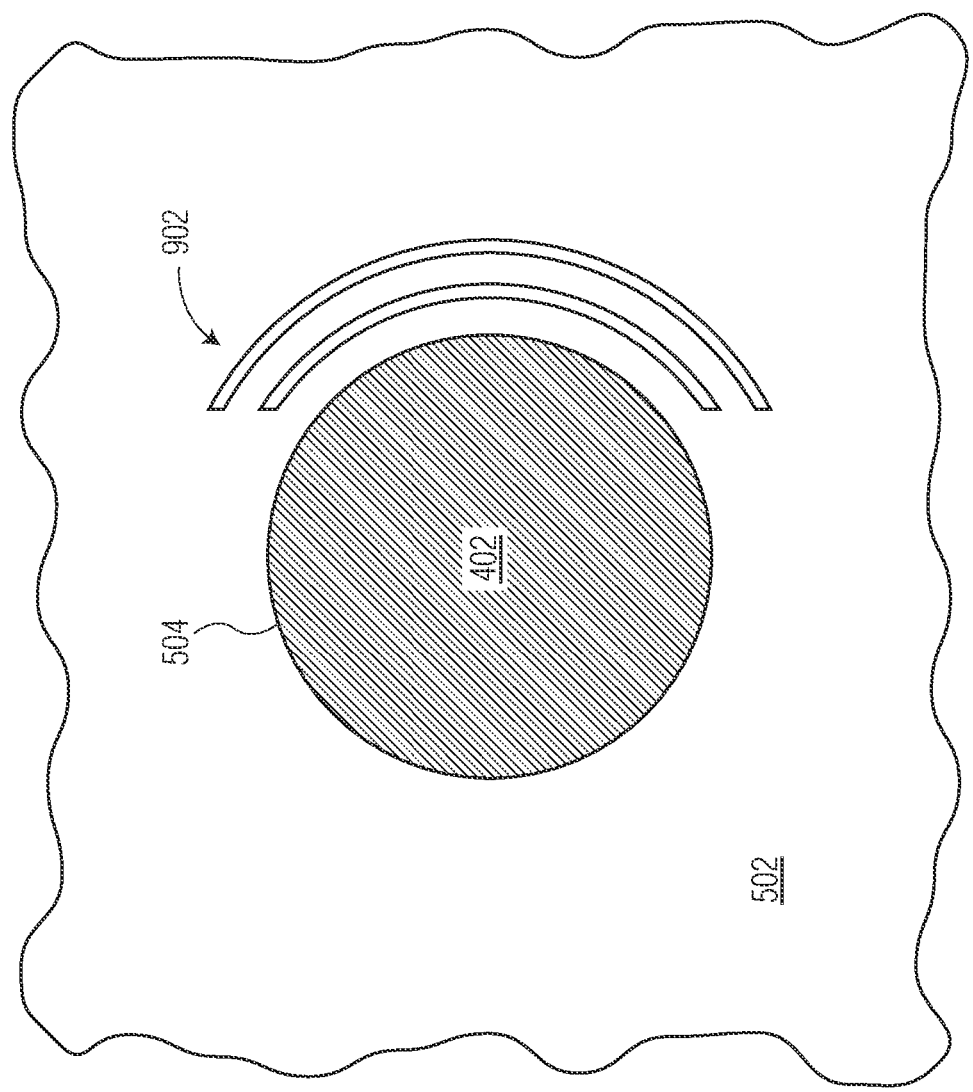

FIG. 9 illustrates, in a simplified plan view, the focused portion of the example semiconductor device 100 with an example laser ablated structure 902 proximate to the opening 504 in accordance with an embodiment. In this embodiment, the laser ablated structure 902 includes a pattern formed as two arcs (e.g., portion of rings) surrounding a portion of the opening 504. Each arc of the laser ablated structure 902 is formed by a laser ablation process which removes material to form a groove or channel in the non-conductive layer 502. In this embodiment, the groove or channel is formed having a predetermined cross-sectional depth dimension in a range of approximately 5-10 microns and a predetermined cross-sectional width dimension in a range of approximately 5-50 microns. In this embodiment, the arcs are located proximate to a side of the perimeter of the opening 504 most likely to experience high stress levels.

Figure 10:
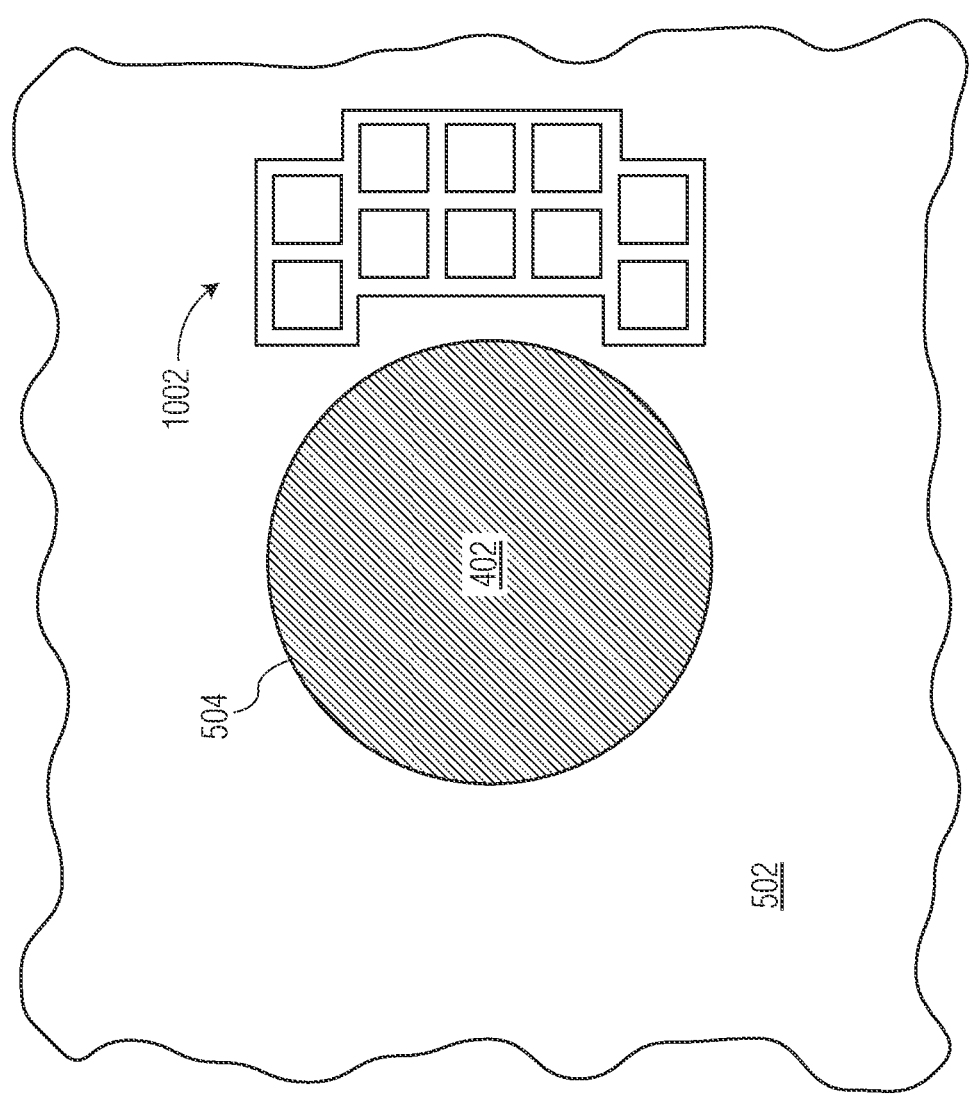

FIG. 10 illustrates, in a simplified plan view, the focused portion of the example semiconductor device 100 with an example laser ablated structure 1002 proximate to the opening 504 in accordance with an embodiment. In this embodiment, the laser ablated structure 1002 includes a pattern formed as a geometric grid surrounding a portion of the opening 504. Each geometric shape (e.g., square) of the laser ablated structure 1002 is formed by a laser ablation process which removes material to form a series of grooves or channels in the non-conductive layer 502. In this embodiment, the grooves or channels are formed having a predetermined cross-sectional depth dimension in a range of approximately 5-10 microns and a predetermined cross-sectional width dimension in a range of approximately 5-50 microns. In this embodiment, the geometric grid is located proximate to a side of the perimeter of the opening 504 most likely to experience high stress levels.

Figure 11:
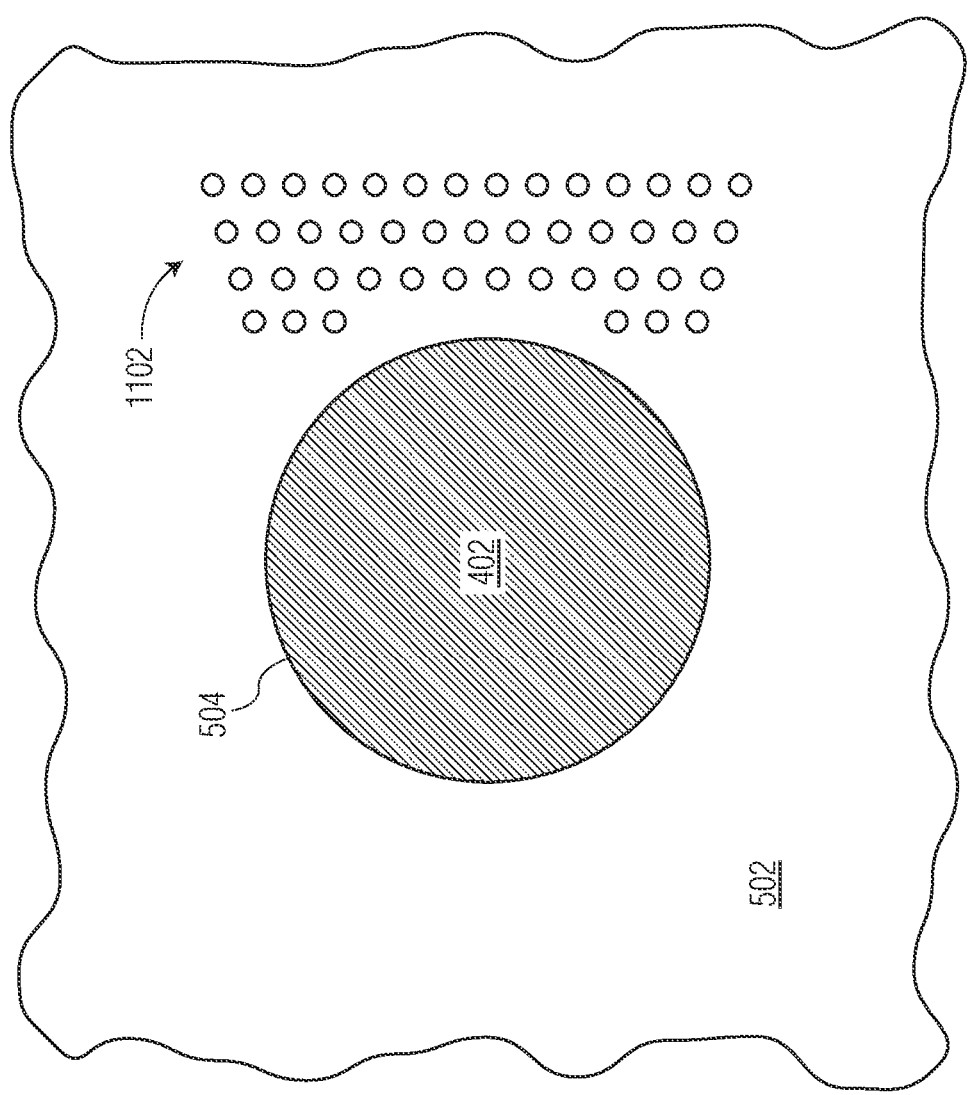

FIG. 11 illustrates, in a simplified plan view, the focused portion of the example semiconductor device 100 with an example laser ablated structure 1102 proximate to the opening 504 in accordance with an embodiment. In this embodiment, the laser ablated structure 1102 includes a pattern formed as a plurality of dots surrounding a portion of the opening 504. Each dot of the laser ablated structure 1102 is formed by a laser ablation process which removes material to form a substantially round cavity in the surface of the non-conductive layer 502. In this embodiment, the cavity is formed having predetermined cross-sectional depth dimension in a range of approximately 5-10 microns and a cross-sectional diameter dimension in a range of approximately 5-50 microns. In this embodiment, the plurality of dots are located proximate to a side of the perimeter of the opening 504 most likely to experience high stress levels.

In one embodiment, there is provided, a method including providing a semiconductor die at least partially encapsulated with an encapsulant; depositing a first non-conductive layer over an active side of the semiconductor die and a first surface of the encapsulant, a first opening formed in the first non-conductive layer exposing a portion of a bond pad of the semiconductor die; forming a conductive interconnect trace over a portion of the first non-conductive layer and the exposed portion of the bond pad; depositing a second non-conductive layer over the conductive interconnect trace and exposed portions of first non-conductive layer, a second opening formed in the second non-conductive layer exposing a portion of the conductive interconnect trace; and forming a first laser ablated structure at a first surface of the second non-conductive layer proximate to a perimeter of the second opening. The method may further include depositing a conductive layer over the first laser ablated structure, the second opening, and the exposed portion of the conductive interconnect trace to form a connector pad. The first laser ablated structure may be configured as a crack arrestor structure. The method may further include forming a second laser ablated structure at the first surface of the encapsulant before depositing the first non-conductive layer, the second laser ablated structure configured to enhance adhesion between the first non-conductive layer and the encapsulant. The method may further include forming a third laser ablated structure at a first surface of the first non-conductive layer before forming the conductive interconnect trace, the third laser ablated structure configured to enhance adhesion between the conductive interconnect trace and the first non-conductive layer. The depositing the second non-conductive layer over the conductive interconnect trace and exposed portions of first non-conductive layer may include depositing the second non-conductive layer over a at least a portion of the third laser ablated structure, the third laser ablated structure further configured to enhance adhesion between the second non-conductive layer and the first non-conductive layer. The first laser ablated structure may be formed at least partially surrounding the perimeter of the second opening. The first laser ablated structure may be formed having a shape characterized as one of an arc, circle, grid, and plurality of dots. The first laser ablated structure may be formed having a depth in a range of approximately 5-10 microns and a cross-sectional width or diameter in a range of approximately 5-50 microns.

In another embodiment, there is provided, a semiconductor device including a semiconductor die at least partially encapsulated with an encapsulant, an active side of the semiconductor die exposed and substantially coplanar with a first surface of the encapsulant; a first non-conductive layer formed over the active side of the semiconductor die and the first surface of the encapsulant; a first opening formed in the first non-conductive layer exposing a portion of a bond pad of the semiconductor die; a conductive interconnect trace formed over a portion of the first non-conductive layer and connected to the exposed portion of the bond pad; a second non-conductive layer formed over the conductive interconnect trace and exposed portions of first non-conductive layer; a second opening formed in the second non-conductive layer exposing a portion of the conductive interconnect trace; and a first laser ablated structure formed at a first surface of the second non-conductive layer proximate to a perimeter of the second opening. The semiconductor device may further include a connector pad formed over the first laser ablated structure, the second opening, and the exposed portion of the conductive interconnect trace, the connector pad interlocked with the first laser ablated structure. The first laser ablated structure may at least partially surround the perimeter of the second opening. The first laser ablated structure may be configured as a crack arrestor structure. The first laser ablated structure may be formed having a shape characterized as one of an arc, circle, grid, and plurality of dots. The semiconductor device may further include a second laser ablated structure formed at the first surface of the encapsulant, the first non-conductive layer interlocked with the second laser ablated structure. The semiconductor device may further include a third laser ablated structure formed at a first surface of the first non-conductive layer, the conductive interconnect trace interlocked with the third laser ablated structure.

In yet another embodiment, there is provided, a method including providing a semiconductor die at least partially encapsulated with an encapsulant, an active side of the semiconductor die exposed and substantially coplanar with a first surface of the encapsulant; depositing a first non-conductive layer over the active side of the semiconductor die and the first surface of the encapsulant; forming a first opening in the first non-conductive layer exposing a portion of a bond pad of the semiconductor die; forming a conductive interconnect trace over a portion of the first non-conductive layer and the exposed portion of the bond pad, the conductive interconnect trace connected to the bond pad; depositing a second non-conductive layer over the conductive interconnect trace and exposed portions of first non-conductive layer; forming a second opening in the second non-conductive layer exposing a portion of the conductive interconnect trace; and forming a first laser ablated structure at a first surface of the second non-conductive layer proximate to a perimeter of the second opening. The method may further include patterning a conductive layer over the first laser ablated structure, the second opening, and the exposed portion of the conductive interconnect trace to form a connector pad. The first laser ablated structure may be configured to at least partially surround the perimeter of the second opening. The first laser ablated structure may be formed having a shape characterized as one of an arc, circle, grid, and plurality of dots.

By now, it should be appreciated that there has been provided a semiconductor device having a laser ablated structure at an under-bump structure. The semiconductor device includes a semiconductor die partially encapsulated with an encapsulant. A non-conductive layer is formed over an active side of semiconductor die and corresponding surface of the encapsulant. An opening in the non-conductive layer is configured as a basis for the under-bump structure. The laser ablated structure is formed in a surface of a non-conductive layer substantially surrounding a perimeter of the opening, for example. The laser ablated structure is formed by removing material from the non-conductive layer in a patterned groove or channel with predetermined cross-sectional width and depth dimensions. A metal layer is deposited over the non-conductive layer and is patterned to form a conductive connector pad (e.g., under-bump structure) over the opening and laser ablated structure. By forming the connector pad in this manner, the connector pad is interlocked with the laser ablated structure and provides improved adhesion between the connector pad and the underlying non-conductive layer while serving to arrest cracks that may form when subjected to extreme stress conditions.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
providing a semiconductor die at least partially encapsulated with an encapsulant;
forming a first laser ablated structure at a first surface of the encapsulant;
depositing a first non-conductive layer over an active side of the semiconductor die and over a first surface of the encapsulant such that he first non-conductive layer is interlocked with the first laser ablated structure, a first opening formed in the first non-conductive layer exposing a portion of a bond pad of the semiconductor die;
forming a conductive interconnect trace over a portion of the first non-conductive layer and the exposed portion of the bond pad;
depositing a second non-conductive layer over the conductive interconnect trace and over exposed portions of first non-conductive layer, a second opening formed in the second non-conductive layer exposing a portion of the conductive interconnect trace; and
forming a second laser ablated structure at the first surface of the second non-conductive layer proximate to a perimeter of the second opening.

2. The method of claim 1, further comprising depositing a conductive layer over the second laser ablated structure, the second opening, and the exposed portion of the conductive interconnect trace to form a connector pad.

3. The method of claim 1, wherein the second laser ablated structure is configured as a crack arrestor structure.

4. The method of claim 1, wherein the first laser ablated structure is configured to enhance adhesion between the first non-conductive layer and the encapsulant.

5. The method of claim 1, further comprising forming a third laser ablated structure at a first surface of the first non-conductive layer before forming the conductive interconnect trace, the third laser ablated structure configured to enhance adhesion between the conductive interconnect trace and the first non-conductive layer.

6. The method of claim 5, wherein depositing the second non-conductive layer over the conductive interconnect trace and exposed portions of first non-conductive layer includes depositing the second non-conductive layer over a at least a portion of the third laser ablated structure, the third laser ablated structure further configured to enhance adhesion between the second non-conductive layer and the first non-conductive layer.

7. The method of claim 1, wherein the second laser ablated structure is formed at least partially surrounding the perimeter of the second opening.

8. The method of claim 1, wherein the second laser ablated structure is formed having a shape characterized as one of an arc, circle, grid, and plurality of dots.

9. The method of claim 1, wherein the second laser ablated structure is formed having a depth in a range of approximately 5-10 microns and a cross-sectional width or diameter in a range of approximately 5-50 microns.

10. A method comprising:
providing a semiconductor die at least partially encapsulated with an encapsulant, an active side of the semiconductor die exposed and substantially coplanar with a first surface of the encapsulant;
forming a first laser ablated structure at a first surface of the encapsulant;
depositing a first non-conductive layer over the active side of the semiconductor die and over the first surface of the encapsulant such that he first non-conductive layer is interlocked with the first laser ablated structure;
forming a first opening in the first non-conductive layer exposing a portion of a bond pad of the semiconductor die;
forming a conductive interconnect trace over a portion of the first non-conductive layer and the exposed portion of the bond pad, the conductive interconnect trace connected to the bond pad;
depositing a second non-conductive layer over the conductive interconnect trace and over exposed portions of first non-conductive layer;
forming a second opening in the second non-conductive layer exposing a portion of the conductive interconnect trace; and
forming a second laser ablated structure at the first surface of the second non-conductive layer proximate to a perimeter of the second opening.

11. The method of claim 10, further comprising patterning a conductive layer over the second laser ablated structure, the second opening, and the exposed portion of the conductive interconnect trace to form a connector pad.

12. The method of claim 10, wherein the second laser ablated structure is configured to at least partially surround the perimeter of the second opening.

13. The method of claim 10, wherein the second laser ablated structure is formed having a shape characterized as one of an arc, circle, grid, and plurality of dots.

* * * * *